US012681044B2

(12) United States Patent
Foong et al.

(10) Patent No.: US 12,681,044 B2
(45) Date of Patent: Jul. 14, 2026

(54) SPRING CONTACT IN A TESTING APPARATUS FOR INTEGRATED CIRCUITS

(71) Applicant: JF MICROTECHNOLOGY SDN. BHD., Petaling Jaya (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY); Grace Ann Nee Yee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 185 days.

(21) Appl. No.: 18/388,599

(22) Filed: Nov. 10, 2023

(65) Prior Publication Data

US 2024/0159796 A1 May 16, 2024

(30) Foreign Application Priority Data

Nov. 11, 2022 (MY) .......................... PI 2022006382

(51) Int. Cl.
G01R 1/067 (2006.01)
G01R 3/00 (2006.01)

(52) U.S. Cl.
CPC ........... G01R 1/06722 (2013.01); G01R 3/00 (2013.01)

(58) Field of Classification Search
CPC ................................................ G01R 1/06722
See application file for complete search history.

(56) References Cited

U.S. PATENT DOCUMENTS

| | | | | |
|---|---|---|---|---|
| 6,471,524 | B1 * | 10/2002 | Nakano ............. | H01R 13/2428 |
| | | | | 439/70 |
| 10,446,965 | B2 | 10/2019 | Foong et al. | |
| 2002/0000821 | A1 * | 1/2002 | Haga .................. | G01R 1/06722 |
| | | | | 324/755.05 |
| 2003/0210063 | A1 * | 11/2003 | Haga .................. | G01R 1/06722 |
| | | | | 324/750.25 |
| 2017/0244189 | A1 * | 8/2017 | Foong ................ | G01R 1/06722 |
| 2017/0250486 | A1 * | 8/2017 | Hachuda ............. | H01R 12/716 |

* cited by examiner

*Primary Examiner* — Paresh Patel
(74) *Attorney, Agent, or Firm* — Maschoff Brennan

(57) ABSTRACT

A vertical spring contact that is constructed of a single piece of electrical conductor, having a central compressible spine that acts as a spring. This contact is also provided with a pair of arms extending downwards from a top member, flanking both sides of the central spine without being in contact with the central spine. The central spine structurally connects the top member to a bottom member. The bottom member is provided with recesses that are adapted to loosely receive the lower tips of the arms. In this way, when the contact is compressed, the lower tips of the arms are pressed into the recesses, thus establishing more contact points for a current to pass through.

9 Claims, 15 Drawing Sheets

SPRING CONTACT IN A TESTING APPARATUS FOR INTEGRATED CIRCUITS

FIELD OF INVENTION

The present invention relates to an electrical contact in an integrated circuit testing apparatus.

BACKGROUND OF INVENTION

There are currently various different types of electrical contacts used as test probes in integrated circuit (IC) device testing. Among these, vertical type contacts have several advantages, such as allowing for better signal integrity and shorter current path between the device terminal and the load board terminal. One sub-type of vertical contacts, known as a vertical spring contact, typically comprises of 3 or 4 individual components, with one of the components being a spring mounted axially to the direction of compression, hence the name vertical spring contact. This type of contact with its multiple components suffers from interference and friction losses, across the components, which results in compromised signal integrity.

A further sub-type of vertical spring contacts are those that have a 2-D planar design. In these, the spring is usually a strip of material that has been bent or formed in a zig-zag or other repetitive configuration in order to form a spring, as opposed to a 3-D design which tends to use circular springs. The springs in the 2-D design types then to bulge out horizontally when compressed. This may cause friction and wear on any surfaces that may come into contact with the bulging material.

Foong, et al (U.S. Pat. No. 10,446,965 B2) discloses a vertical spring contact that is constructed of a single piece of electrical conductor, having a central spine that structurally connects a top member to a bottom member. A pair of arms extends downwards from the top member, flanking both sides of the central spine without being in contact with it. This design solves the problems of horizontal bulging as well as those afflicted by having multiple components. However, this design suffers from a deterioration of compressive strength with larger deflections of the contact during a test, due to the low number of "coils" in its central spine. In some devices, such as those with ball grid array (BGA) packages, the thickness tolerance is larger and therefore requires the test contacts to deflect more. This can cause the central spine of U.S. Pat. No. 10,446,965 B2 to break prematurely.

What is needed in the art is a vertical spring contact that able to maintain good electrical contact over a larger range of deflections.

SUMMARY OF INVENTION

The present invention seeks to overcome the aforementioned disadvantages by providing a vertical spring contact that is constructed of a single piece of electrical conductor, having a central spine formed from a vertical row of horizontal sections connected to each other with curved sections, resulting in the central spine having a sinuous shape and acting as a spring. This contact is also provided with a pair of arms extending downwards from a top member, flanking both sides of the central spine without being in contact with the central spine. The central spine structurally connects the top member to a bottom member. The bottom member is provided with recesses that are adapted to loosely receive the lower tips of the arms. In this way, when the contact is compressed, the lower tips of the arms are pressed into the recesses, thus establishing more contact points for a current to pass through.

This invention thus relates to an electrical contact for use in an integrated circuit testing apparatus, comprising: a central spine formed of a vertical row of horizontal sections connected to each other with curved sections, resulting in the central spine having a compressible, sinuous shape that acts like a spring, the vertical axis being a movement axis of the electrical contact during a test; a top section having a first arm and a second arm extending downwards from opposing sides of the top section, thus said first and second arms substantially enveloping the central spine on opposing sides, and an upper end of the central spine connected to the top section in between where the first and second arms extend; and a bottom section connected to a lower end of the central spine, said bottom section provided with a first recess and a second recess, each said recess adapted to loosely receive a first tip of the first arm and a second tip of the second arm, respectively. The first and second arms are never in contact with the central spine in either a compressed or uncompressed state. The first tip and second tip are not in contact with the first recess and second recess, respectively in an uncompressed state, and establish contact with the first recess and second recess, respectively, in a pre-loaded state, which is the state in which the contact has been installed into the testing apparatus leading up to a test.

Due to the sinuous shape of the central spine, more "coils" can fit in a given height compared to the central spine design in U.S. Pat. No. 10,446,965 B2. Having more "coils" in the central spine provides this contact with superior compressive strength over a larger range of deflection. This makes it more suitable for many applications, and especially for those that incorporate BGA packages, where there is a large variation in the thickness tolerances. The larger range of deflection available to the contact of this invention also make it more forgiving when used with imprecise mechanical handlers, which may exhibit large deflections in the vertical axis. The larger range of deflection also allow this contact to be used with load boards that may have damaged landing pads, as the higher stroke mitigates any potentially poor electrical contact. Yet another advantage of a larger deflection in the contact is that the required contact force during a test can be more accurate controlled by the mechanized handler by merely adjusting the amount of deflection.

This sinuous shaped central spine also translates to a longer service lifespan of the contact.

In a preferred embodiment, the first tip and second tip are bent inwards, towards the direction of the central spine, and the corresponding first recess and second recess are also sloped inwards to accommodate for this bending. When the contact is compressed during testing, outer surfaces of each tip are pressed into wall surfaces of the recesses. This tapered design reverses back to the initial position when the contact is uncompressed. This results in a very strong contact between the arms and the walls of the recesses, which results in a better overall electrical contact.

In another preferred embodiment, the central spine, top section and bottom section are made from a single piece of an electrically conductive material.

In another preferred embodiment, the central spine is designed such that it compresses in a vertical direction without significant bulging in a horizontal direction.

In another preferred embodiment, there is provided a stopper comprising a pair of horizontal members protruding from opposing sides of the top section, above where the first and second arms extend from the top section, said stopper adapted to engage with a stationary part of the testing apparatus when the contact is installed so as to create a preload in the central spine leading up to a test. In U.S. Pat. No. 10,446,965 B2, the arms themselves were used as a stopper, resulting in stresses that cause deformation of the arms and unwanted rubbing of the arms against the central spine. The addition of a stopper in the present invention thus removes these stresses from the arms and allows the arms to perform more effectively and for a longer time. The engagement of the stopper to the stationary part of the testing apparatus also causes the contact to be aligned substantially to the vertical axis.

In another preferred embodiment, there is provided an enclosure adapted to prevent the first and second arms from any excessive bending that causes the tips to skip out of the recesses during handling and installation of the contact into the testing apparatus. The enclosure is joined to the bottom section and rises to form two bars, each bar located on opposite sides of the arms near the tips, the bars do not touch the first and second arms or their tips during a normal operation of the apparatus, but located closely enough to said arms and tips so as to prevent their excessive movement, thus keeping the tips within the recesses. Not having the arms skip out of the recesses saves time and effort during installation of the contacts into the testing apparatus.

In another preferred embodiment, a length from the stopper to the top of the contact, which we shall call the "neck" of the contact, is at least 20% of the total height of the contact. This longer neck allows more precise positional alignment of the contact when installing it into a through-hole in a cover plate.

In another preferred embodiment, the first recess and second recess are formed from a third arm and a fourth arm, respectively, said third and fourth arms protruding out from opposing sides of the bottom section. In this embodiment, the length of the portion of the bottom section below the third and fourth arms, which we shall call the "foot" of the contact, is at least 8% of the total height of the contact. This longer foot allows more precise control of the bottom section of the contact within through-holes in a socket housing. The longer "neck" and "foot" sections result in easier and more efficient installation of the contact into the testing apparatus.

This invention also relates to the way the electrical contact is installed into the testing apparatus, which is by using the following steps:
    a. place a retainer onto a cover plate, both being in an upside down orientation;
    b. thread each contact through eyelets in the retainer; and
    c. lower a socket housing onto the cover plate, such that each contact is threaded through through-holes provided on the socket housing.

Other objects and advantages will be more fully apparent from the following disclosure and appended claims.

4

Figure 3:
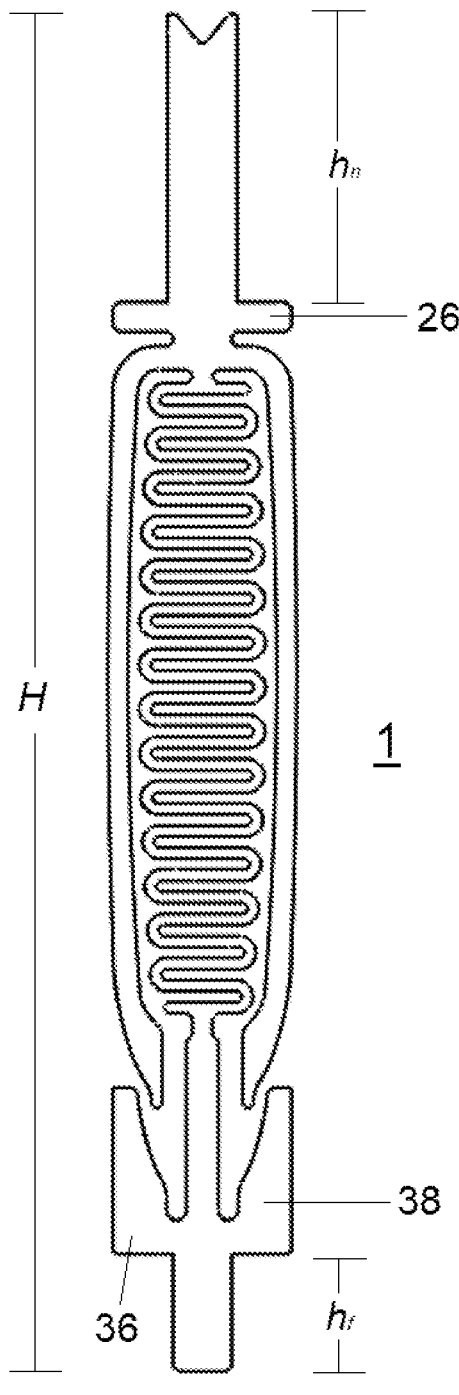
Figure 4:
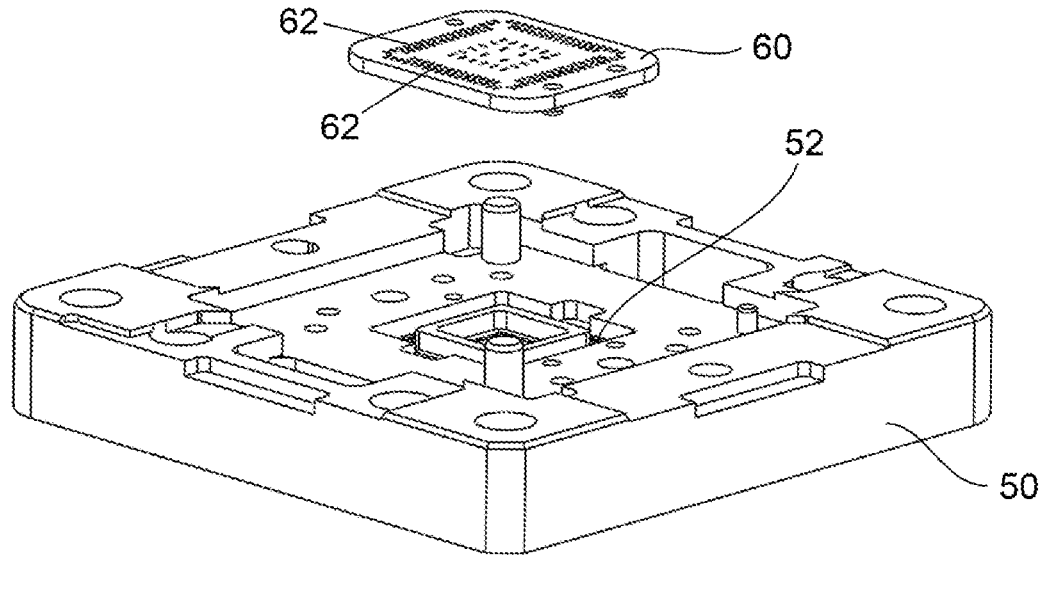
Figure 5:
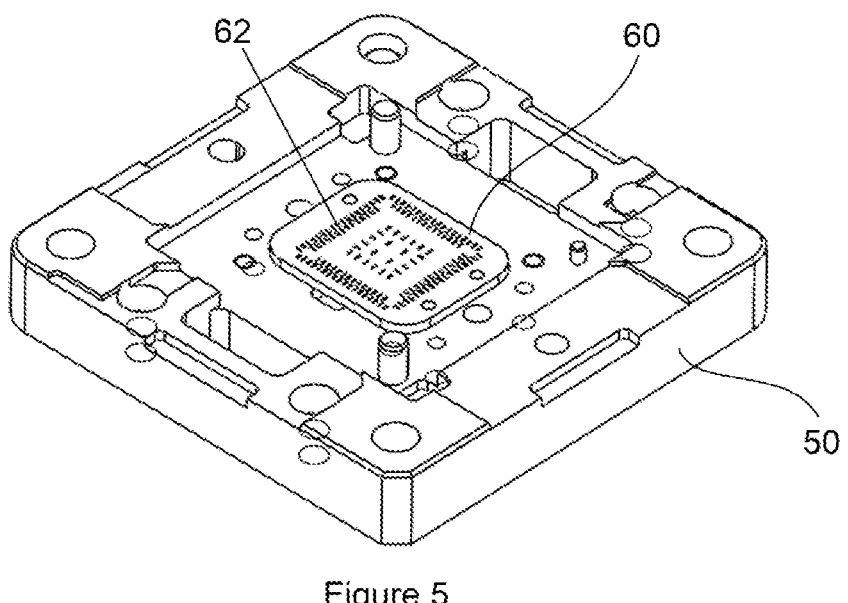
Figure 6:
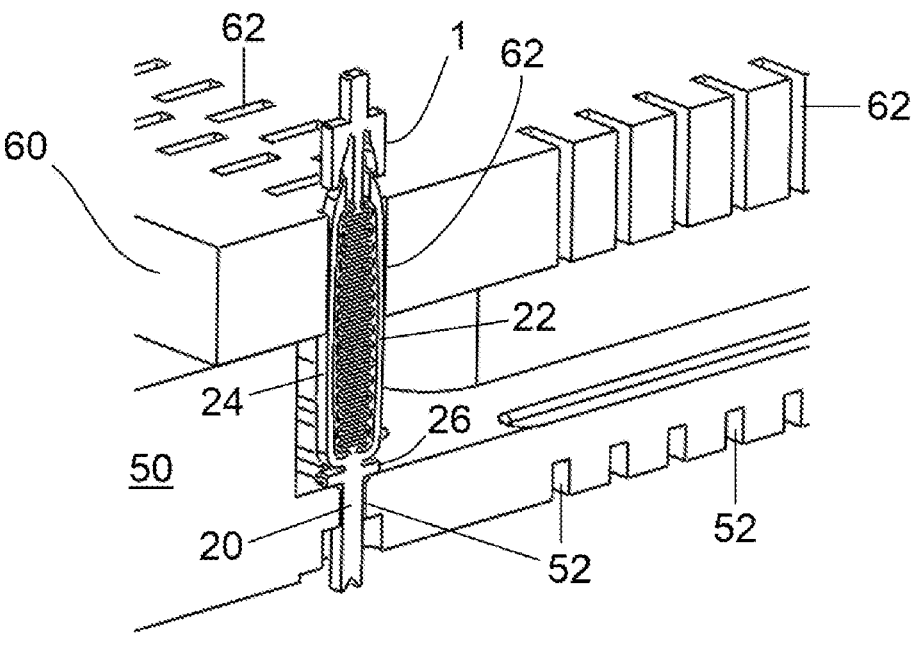
Figure 7:
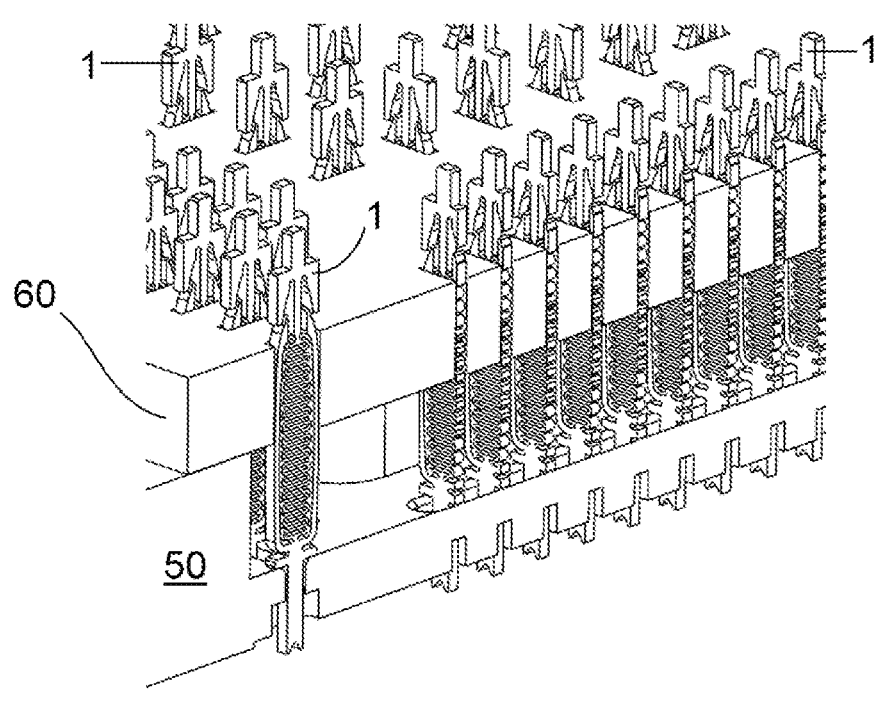
Figure 8:
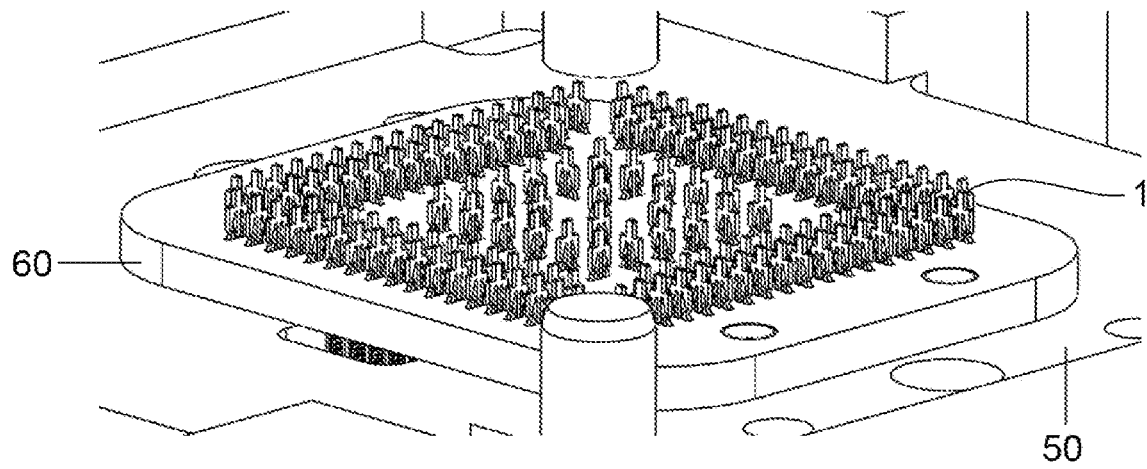
Figure 9:
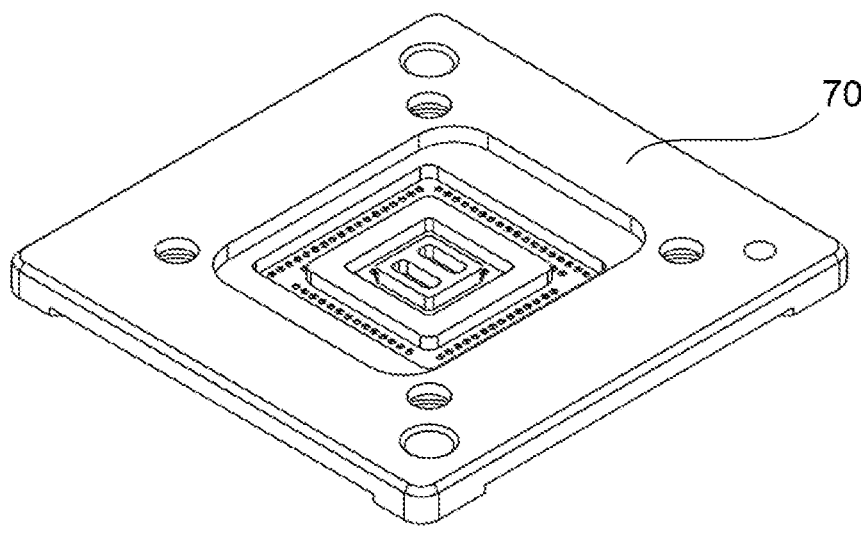
Figure 10:
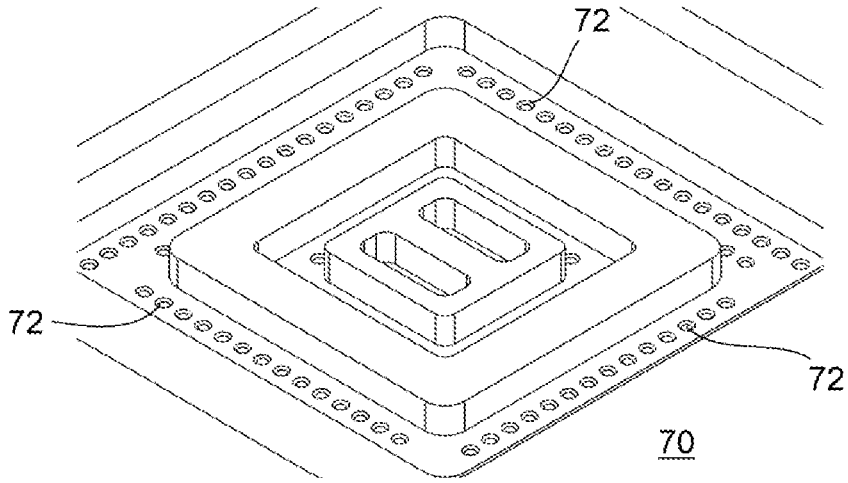
Figure 11:
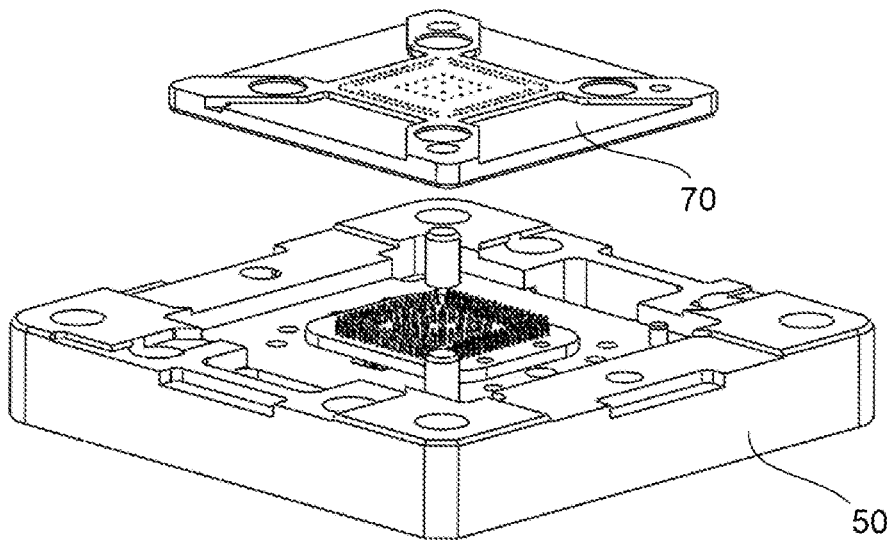
Figure 12:
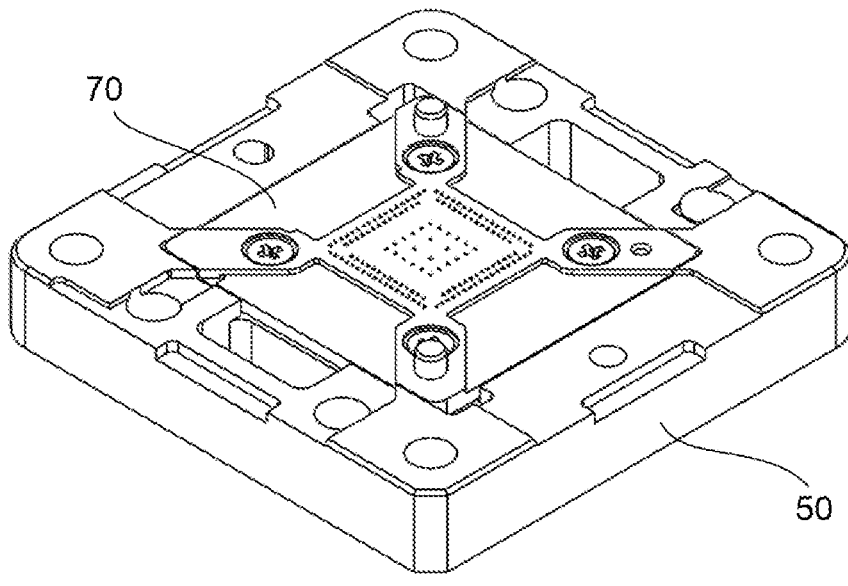
Figure 13:
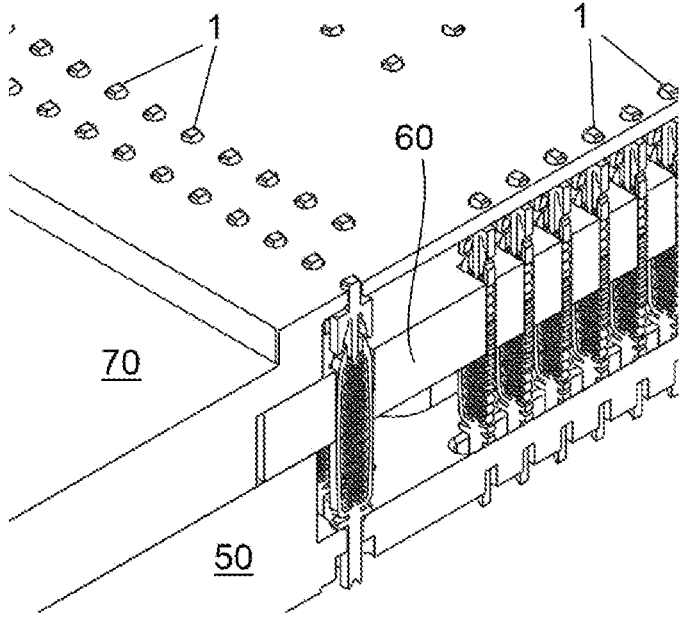
Figure 14A:
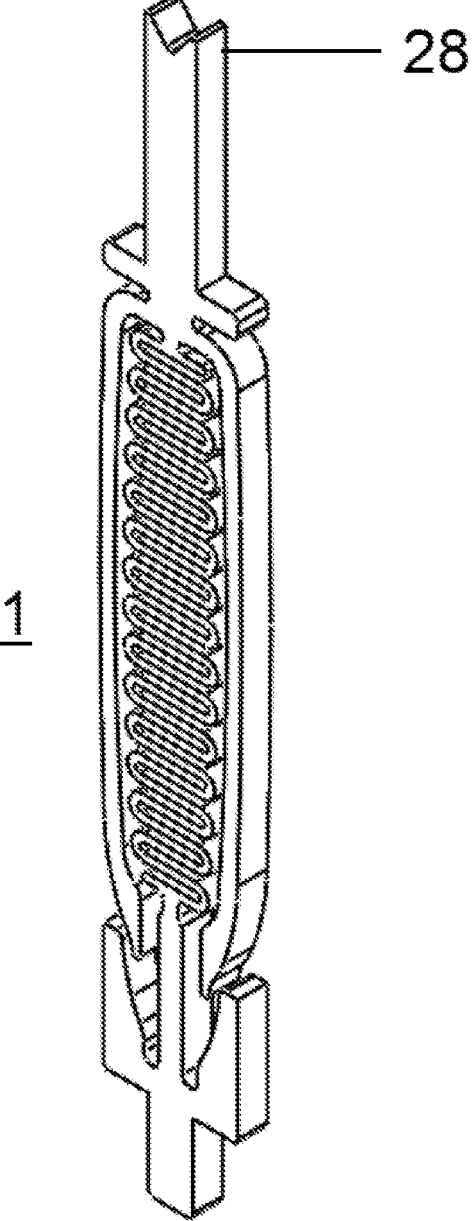
Figure 14B:
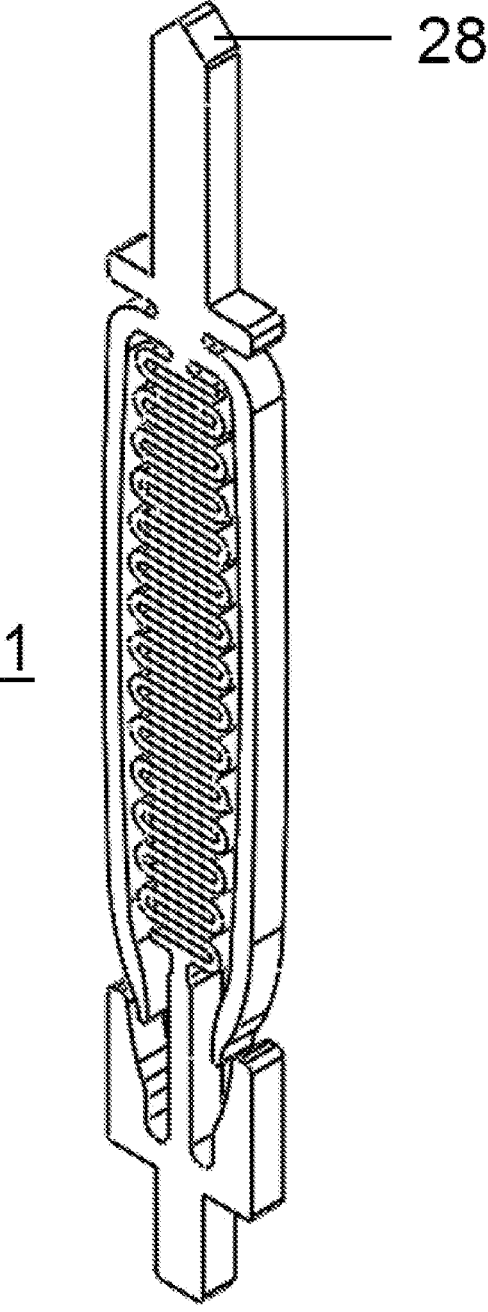
Figure 14C:
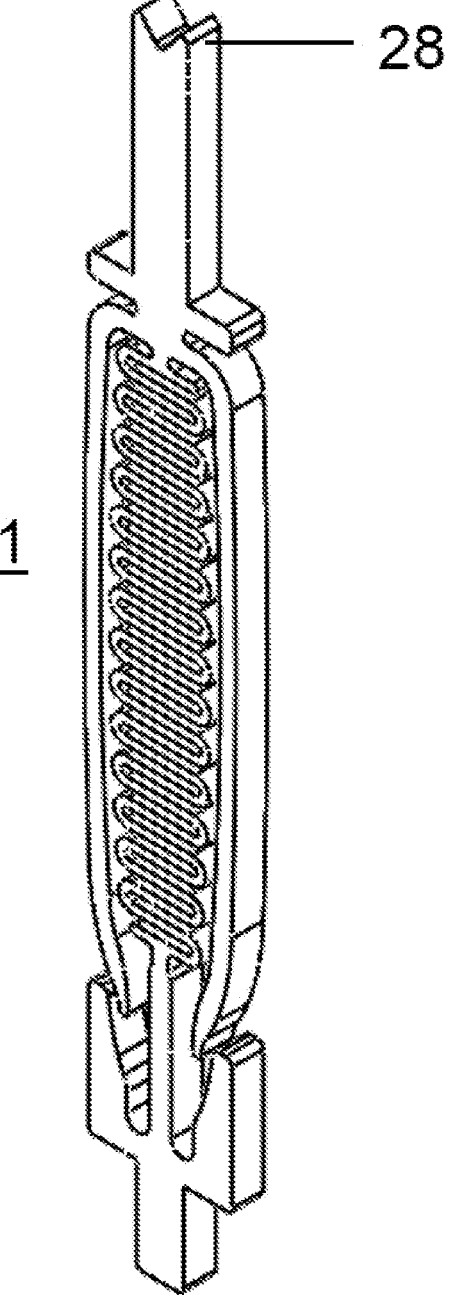
Figure 14D:
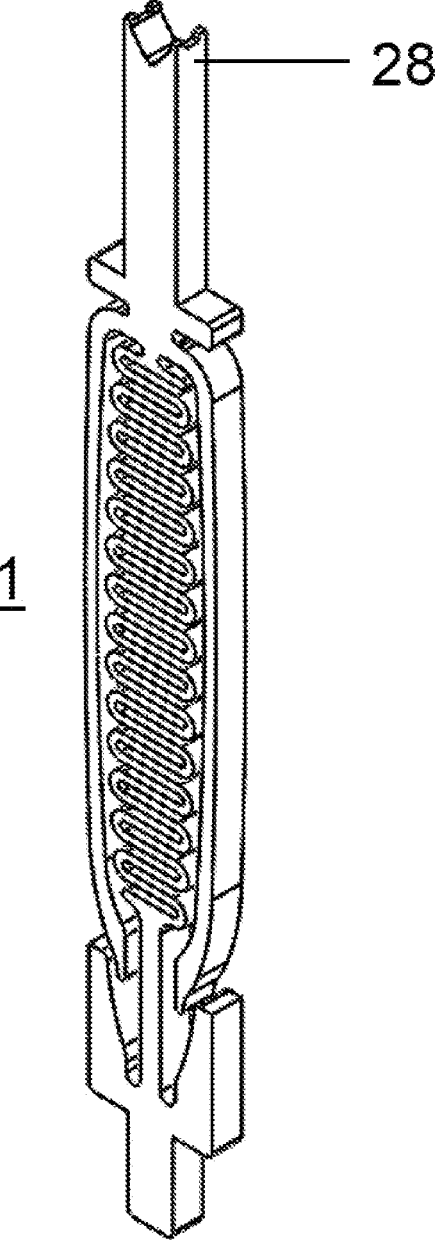

FIG. 3 shows a front view of a contact in a first embodiment of this invention.
FIG. 4 shows an isometric view of a cover plate and retainer in an embodiment of this invention.
FIG. 5 shows an isometric view of a cover plate and retainer in an embodiment of this invention.
FIG. 6 shows a cross-sectional view of an electrical contact, cover plate and retainer in an embodiment of this invention.
FIG. 7 shows a cross-sectional view of electrical contacts, a cover plate and retainer in an embodiment of this invention.
FIG. 8 shows an isometric view of electrical contacts, a cover plate and retainer in an embodiment of this invention.
FIG. 9 shows an isometric view of a socket housing in an embodiment of this invention.
FIG. 10 shows an isometric view of a socket housing in an embodiment of this invention.
FIG. 11 shows an isometric view of a testing apparatus in an embodiment of this invention.
FIG. 12 shows an isometric view of a testing apparatus in an embodiment of this invention.
FIG. 13 shows a cross-sectional view of a testing apparatus in an embodiment of this invention.
FIG. 14a shows an isometric view of a contact in a third embodiment of this invention.
FIG. 14b shows an isometric view of a contact in a fourth embodiment of this invention.
FIG. 14c shows an isometric view of a contact in a fifth embodiment of this invention.
FIG. 14d shows an isometric view of a contact in a sixth embodiment of this invention.

DETAILED DESCRIPTION OF INVENTION

It should be noted that the following detailed description is directed to a spring contact of an integrated circuit (IC) testing apparatus, and is not limited to any particular size or configuration but in fact a multitude of sizes and configurations within the general scope of the following description.

LIST OF NUMBERED ELEMENTS IN FIGURES

Central spine (10)
Upper end of central spine (100)
Horizontal sections (110)
Curved sections (112)
Lower end of central spine (120)
Top section (20)
First arm (22)
First tip (221)
Second arm (24)
Second tip (241)
Stopper (26)
Tip (28)
Bottom section (30)
First recess (32)
Second recess (34)
Third arm (36)
Fourth arm (38)
Enclosure (40)
Bars (42)
Cover plate (50)
Cover plate through-holes (52)
Retainer (60)

Retainer eyelets (62)

Socket housing (70)

Socket housing through-holes (72)

Figure 1A:
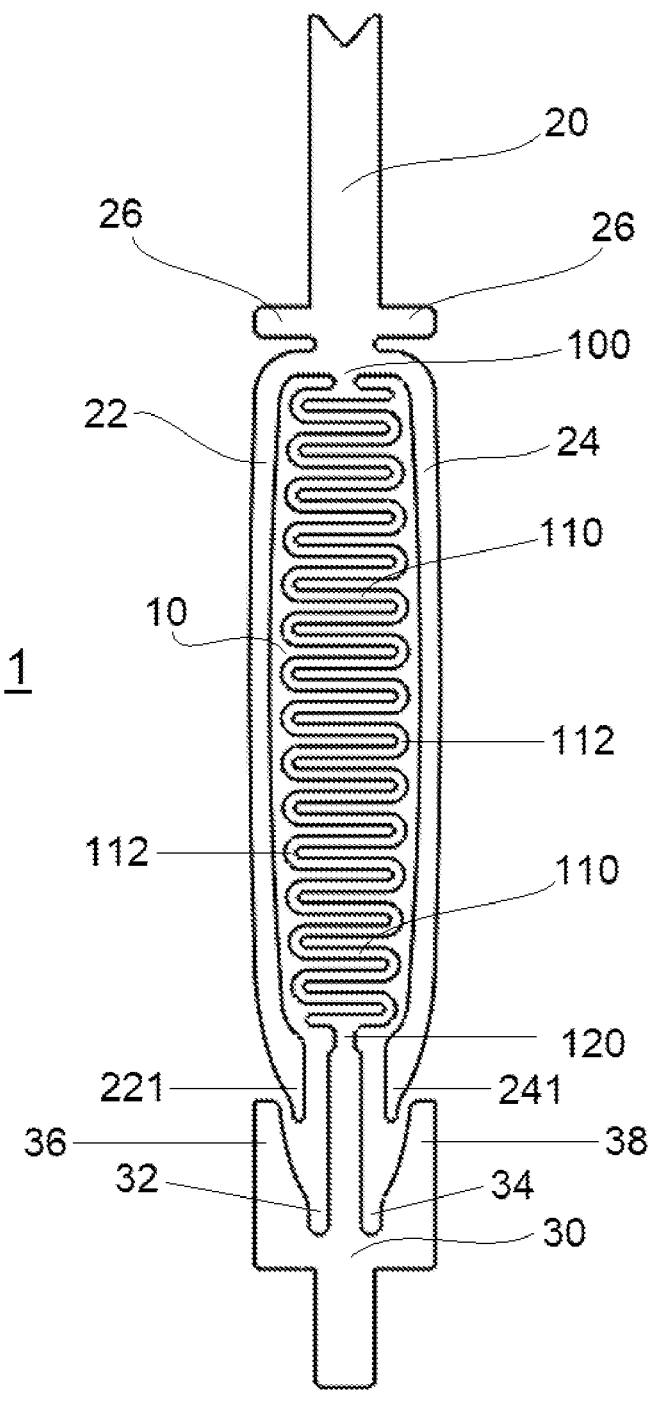
FIG. 1a shows a front view of a contact in a first embodiment of this invention.
Figure 1B:
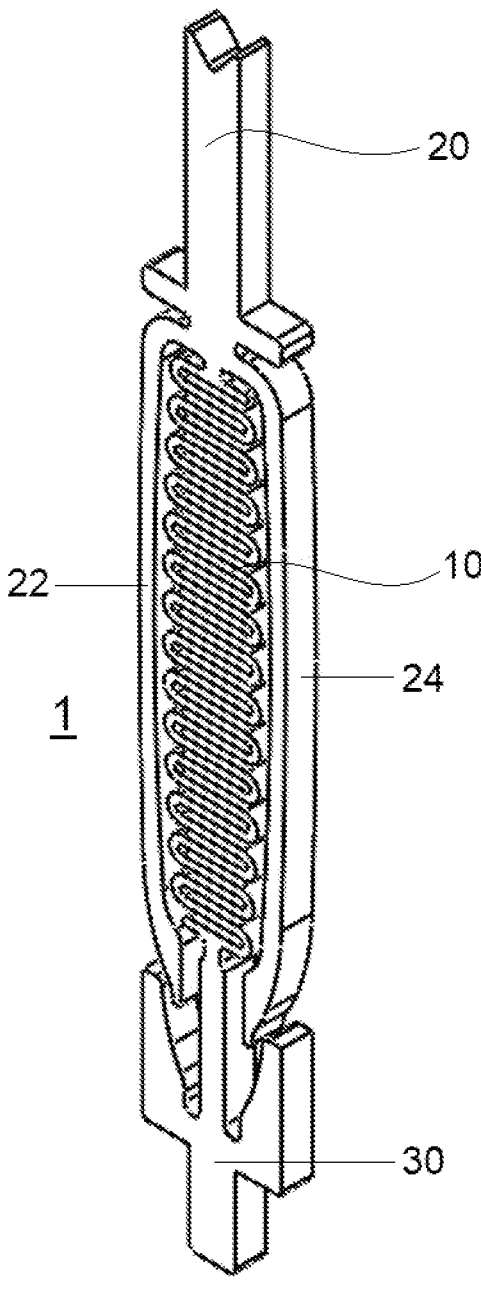
FIG. 1b shows an isometric view of a contact in a first embodiment of this invention.

Referring to FIGS. 1*a* and 1*b*, there are shown views of an electrical contact (1) for use in an integrated circuit testing apparatus in a first embodiment of the present invention. There can be seen a central spine (10), which is formed of a vertical row of horizontal sections (110) connected to each other with curved sections (112). This results in the central spine (10) having a compressible, sinuous shape that acts like a spring. In the context of this application, "vertical" and "vertical axis" is the movement axis of the electrical contact (1) during a test. The contact (1) also comprises a rigid top section (20) having a first arm (22) and a second arm (24) extending downwards from opposing sides of it, thus the first (22) and second (24) arms substantially envelope the central spine (10) on opposing sides. An upper end (100) of the central spine (10) joins the top section (20) in between where the first (22) and second (24) arms extend. A rigid bottom section (30) is also provided, this bottom section (30) joining to a lower end (120) of the central spine (10), the bottom section (30) having a third arm (36) and a fourth arm (38) extending from an intermediate point and on opposing sides of the bottom section (30). These third (36) and fourth (38) arms extend outwards and then upwards, thus forming a first recess (32) and a second recess (34), respectively. These first (32) and second (34) recesses are adapted to loosely receive a first tip (221) of the first arm (22) and a second tip (241) of the second arm (24), respectively. The arms (22, 24) are flexible to the extent that they can be "pinched" together with an external force. When the arms (22, 24) are pinched towards each other, the tips (221, 241) move closer together. When pinched, the resilient arms (22, 24) have a natural tendency to revert to their initial position, and to "unpinch" themselves, and so exert an outward force when they are pinched. This force increases contact between the arms (22, 24) and the recesses (32, 34).

The first (22) and second (24) arms are never in contact with the central spine (10) in either a compressed or uncompressed state. The first tip (221) and second tip (241) are not in contact with the first recess (32) and second recess (34), respectively in an uncompressed state, and only establish contact with the first recess (32) and second recess (34), respectively, during a test, when the central spine (10) is significantly compressed.

Still referring to FIGS. 1*a* and 1*b*, there is provided a stopper (26) comprising a pair of horizontal members protruding from opposing sides of the top section (20), above where the first (22) and second (24) arms extend from the top section (20). The stopper (26) is adapted to engage with a stationary part of the testing apparatus, such as a cover plate or housing (this will be shown and explained further in following figures), when the contact (1) is installed so as to create a preload in the central spine (10) leading up to a test. The stopper (26) eliminates any stresses on the arms (22, 24) during installation and testing that would otherwise occur without a stopper, and thus allows the arms (22, 24) to perform more effectively and for a longer time.

The first tip (221) and second tip (241) are bent inwards, and the corresponding first recess (32) and second recess (34) are also sloped inwards to accommodate for this bending. The entire electrical contact (1) comprising the top section (20), first and second arms (22, 24), central spine (10), bottom section (30), and third (36) and fourth (38) arms, is constructed from a single piece of an electrically conductive material.

Figure 1C:
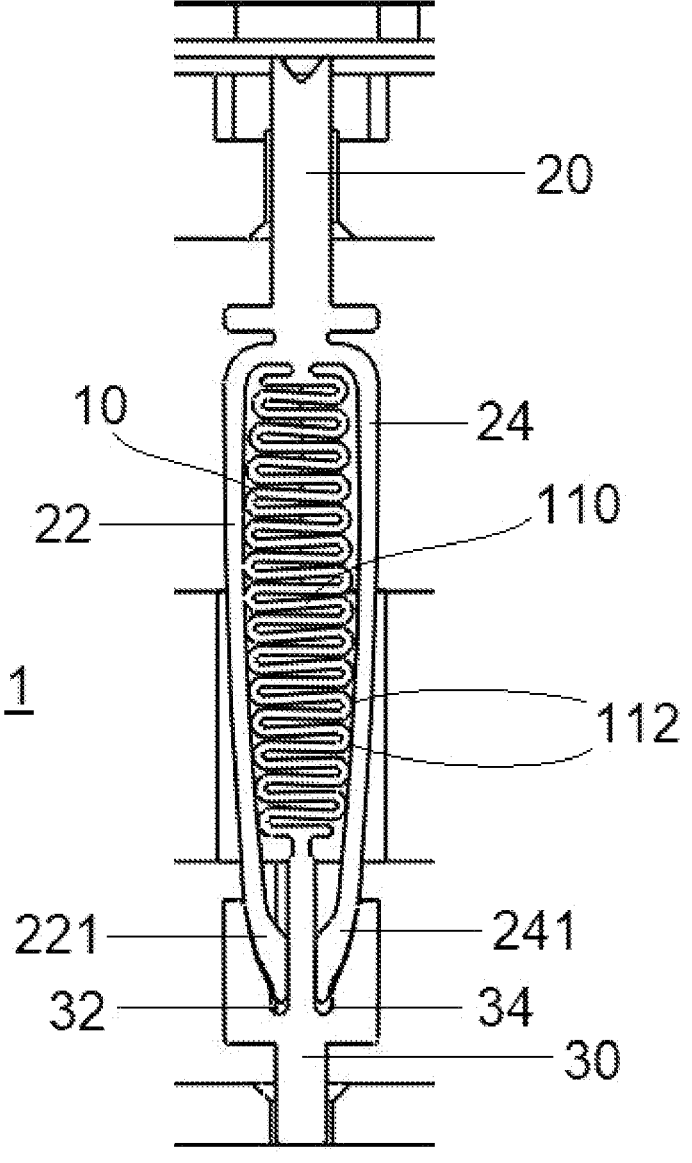
FIG. 1c shows a front view of a contact in a compressed state in a first embodiment of this invention.

During a test of an IC device, the top section (20) and bottom section (30) are pushed towards each other, thus compressing the central spine (10). This is shown in FIG. 1*c*, where a compression of the central spine (10) causes the usually horizontal sections (110) to be deflected off the horizontal, and the curved sections (112) to move closer to adjacent curved sections (112). In this state, the tips (221, 241) contact the recesses (32, 34), which forces the arms (22, 24) to "pinch" inwards. This inwards pinching of the resilient arms produces an opposing outwards force, thus providing better electrical conduction between the tips (221, 241) and the recesses (32, 34).

Figure 2A:
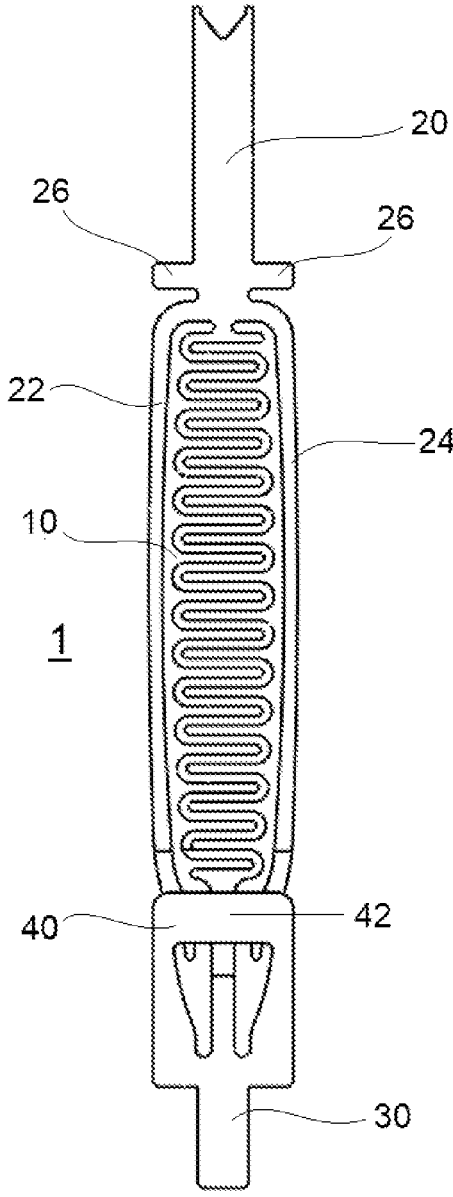
FIG. 2a shows a front view of a contact in a second embodiment of this invention.
Figure 2B:
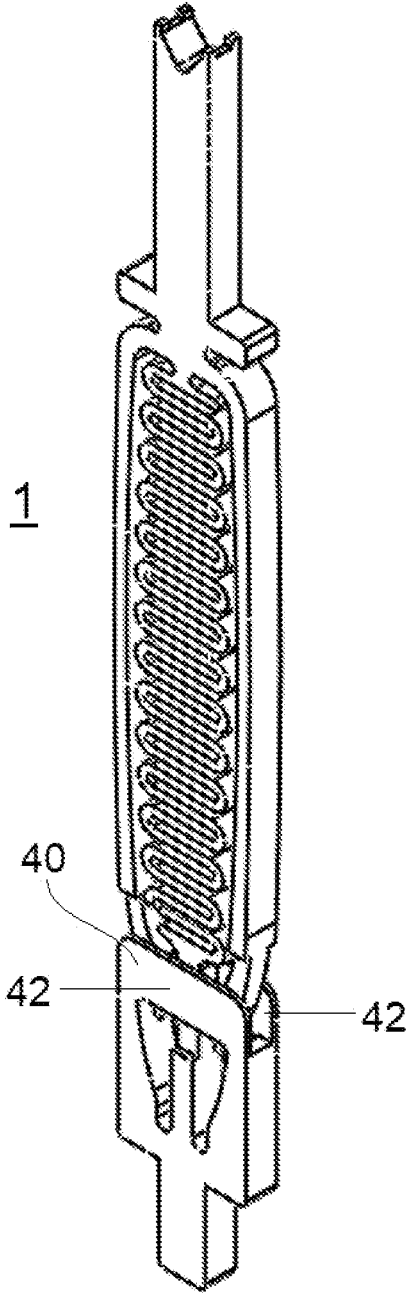
FIG. 2b shows an isometric view of a contact in a second embodiment of this invention.

Referring now to FIGS. 2*a* and 2*b*, there are shown views of an electrical contact (1) for use in an integrated circuit testing apparatus in a second embodiment of the present invention. This second embodiment is the same as the first embodiment above, except for the addition of an enclosure (40) to the bottom section (30). This enclosure (40) is adapted to prevent the first (22) and second (24) arms from any excessive bending that causes the tips (221, 241) to skip out of the recesses during the handling and installation of the contact (1) into the testing apparatus. The enclosure (40) comprises two bars (42) joined to the tops of the third (36) and fourth (38) arms. Each bar (42) is located on opposite sides of the arms (22, 24) near the tips (221, 241). The bars (40) do not touch the first (22) and second (24) arms or their tips (221, 241) during a normal operation of the apparatus, but are located closely enough to the arms (22, 24) and tips (221, 241) so as to prevent their excessive movement in a direction perpendicular across a horizontal plane to the "pinching" movement of the arms (22, 24) during a test. This prevents the tips (221, 241) from "skipping" out from within the recesses, which saves time and effort during installation of the contacts (1) into the testing apparatus.

Referring to FIG. 3, a length from the top of the stopper (26) to the top of the contact (1), which we shall call the "neck" of the contact and represented by $h_n$, is at least 20% of the total height, H, of the contact. This is longer than "necks" from previous designs, and allows more precise positional alignment of the contacts (1) when installing them into through-holes in a cover plate (shown in following figures). A length of the portion of the bottom section below the third (36) and fourth (38) arms, which we shall call the "foot" of the contact and represented by $h_f$, is at least 8% of the total height, H, of the contact. This is longer than "feet" from previous designs, and allows more precise control of the bottom section of the contact within through-holes in a socket housing (shown in following figures). This results in easier and more efficient installation of the contacts (1) into the testing apparatus.

Installation Method of the Contact

FIGS. 4 through 13 illustrate the way the electrical contact of this invention is installed and the testing apparatus assembled.

Referring to FIG. 4, there is shown a cover plate (50) placed upside down. The cover plate (50) is provided with a plurality of cover plate through-holes (52). There is also shown a retainer (60) provided with a plurality of eyelets (62), the eyelets (62) aligning vertically with the cover plate through-holes (52) once installed. The retainer (60) is lowered onto the cover plate (50). The layout of the eyelets (62) shown in the figures is only an example, and can be changed in accordance with the particular pin layout of the IC device being tested. FIG. 5 shows the retainer (60) having been installed onto the cover plate (50). The next step, as can be seen in FIG. 6, is the installation of a contact (1) by threading it through an eyelet (62) and with its top section (20)

threading through a through-hole (52) of the cover plate (50). The stopper (26) of the contact (1) engages with a bottom surface (shown as an upward facing surface in FIG. 6) of the cover plate (50), thus preventing the contact (1) from further travel through the through-hole (52) which could cause stress and/or damage to the arms (22, 24). The engagement of the stopper (26) to the bottom surface of the cover plate also causes the contact (1) to be aligned substantially to the vertical axis.

FIGS. 7 and 8 show views of the assembly once all the contacts (1) have been installed. At this stage, the contacts are still uncompressed. Next, a socket housing (70) as shown in FIGS. 9 and 10 is lowered onto the assembly. The socket housing is provided with a plurality of through-holes (72) that are aligned with the layout of the contacts (1). As can be seen in FIG. 10, each through-hole (72) has a chamfered edge so that as the socket housing (70) is lowered onto the assembly, they act to guide each contact (1) into the correct through-hole (72). FIGS. 12 and 13 show views of the completed assembly of the testing apparatus. Once the socket housing (70) is installed onto the assembly, the contacts (1) are in a pre-loaded, semi-compressed state, and they are ready to perform a test.

FIGS. 14a through 14d each show a different embodiment, whereby the tip (28) of the contact (1) is adapted to fit with a particular device that is being tested. FIG. 14a shows a tip (28) having a V-shape, which is adapted to fit ball grid array (BGA) devices. FIG. 14b shows a tip (28) having an A-shape, which is adapted to fit QFN, QFP, DFN and LGA devices. FIG. 14c shows a tip (28) having a V-shape with a chamfer, which is adapted to fit BGA devices with harder balls. FIG. 14d shows a tip (28) having an island V-shape, which is adapted for a more secure grasp on BGA devices.

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. An electrical contact for use in an integrated circuit testing apparatus, comprising:

a central spine formed of a vertical row of horizontal sections connected to each other with curved sections, resulting in the central spine having a compressible, sinuous shape, the vertical axis being a movement axis of the electrical contact during a test;

a top section having a first arm and a second arm extending downwards from opposing sides of said top section, thus said first and second arms substantially enveloping the said central spine on opposing sides, and an upper end of said central spine connected to the top section in between where the said first and second arms extend;

a bottom section connected to a lower end of said central spine, said bottom section provided with a first recess and a second recess, each said recess adapted to loosely receive a first tip of said first arm and a second tip of said second arm, respectively; and an enclosure adapted to prevent the first and second arms from any excessive bending that causes the tips to skip out of the recesses, wherein the enclosure is joined to the bottom section and rises to form two bars, each said bar located on opposite sides of the arms near the tips, the bars not touching the first and second arms or tips during a normal operation of the apparatus, but located closely enough to said arms and tips so as to prevent their excessive movement, thus keeping the tips within the recesses.

2. The electrical contact for use in an integrated circuit testing apparatus according to claim 1, wherein the central spine, top section and bottom section are made from a single piece of an electrically conductive material.

3. The electrical contact for use in an integrated circuit testing apparatus according to claim 1, wherein the central spine is designed such that it compresses in a vertical direction without any bulging in a horizontal direction.

4. The electrical contact for use in an integrated circuit testing apparatus according to claim 1, further comprising a stopper comprising a pair of horizontal members protruding from opposing sides of said top section, above where the said first and second arms extend from said top section, said stopper adapted to engage with a stationary part of the testing apparatus when the contact is installed so as to create a preload in the central spine leading up to a test.

5. The electrical contact for use in an integrated circuit testing apparatus according to claim 4, wherein said engagement of the stopper to the stationary part of the testing apparatus causes the contact to be aligned substantially to the vertical axis.

6. The electrical contact for use in an integrated circuit testing apparatus according to claim 4, wherein a length from the stopper to the top of the contact is at least 20% of the total height of the contact.

7. The electrical contact for use in an integrated circuit testing apparatus according to claim 1, wherein the first recess and second recess are formed from a third arm and a fourth arm, respectively, said third and fourth arms protruding out from opposing sides of the bottom section.

8. The electrical contact for use in an integrated circuit testing apparatus according to claim 7, wherein a length of the portion of the bottom section below the third and fourth arms is at least 8% of the total height of the contact.

9. The electrical contact for use in an integrated circuit testing apparatus according to claim 1, wherein the contact is installed into the testing apparatus using the following steps:

a. place a retainer onto a cover plate, both being in an upside down orientation;

b. thread each contact through eyelets in the retainer; and c. lower a socket housing onto the cover plate, such that each contact is threaded through through-holes provided on the socket housing.

* * * * *